United States Patent
Loxley et al.

(10) Patent No.: US 7,410,814 B1
(45) Date of Patent: Aug. 12, 2008

(54) PROCESS AND APPARATUS FOR CLEANING SILICON WAFERS

(76) Inventors: Ted A. Loxley, 236 Tom Corwin Rd., Wellston, OH (US) 45692; Vincent A. Greene, 25931 Euclid Ave., Suite 116, Cleveland, OH (US) 44132

( * ) Notice: Subject to any disclaimer, the term of this patent is extended or adjusted under 35 U.S.C. 154(b) by 0 days.

(21) Appl. No.: 11/254,248

(22) Filed: Oct. 19, 2005

Related U.S. Application Data

(63) Continuation-in-part of application No. 09/490,162, filed on Jan. 22, 2000.

(60) Provisional application No. 60/116,940, filed on Jan. 23, 1999.

(51) Int. Cl.
*H01L 21/31* (2006.01)

(52) U.S. Cl. .................. 438/4; 438/690; 438/746; 134/1.2; 134/1.3; 257/E21.483

(58) Field of Classification Search ............ 438/4, 438/690, 746, 906; 134/1, 1.2, 1.3
See application file for complete search history.

(56) References Cited

U.S. PATENT DOCUMENTS 5,733,434 A * 3/1998 Harada et al. ............ 205/746
6,136,669 A * 10/2000 Flitsch et al. ............ 438/466

* cited by examiner

*Primary Examiner*—Alexander G Ghyka
(74) *Attorney, Agent, or Firm*—Vincent A. Greene

(57) ABSTRACT

An effective electropurge process and apparatus for wet processing of semiconductor wafers applies electrical charges to the wafer surface with an ample voltage sufficient to provide an effective field intensity which can substantially eliminate intolerable sub-0.05 micron "killer" defects when making highly advanced microchips with a feature size or line width less than 0.15 micron. The process can be used with frequent voltage reversal for automated wet-batch cleaning operations using cassettes that hold 10 to 50 wafers at a time and in various other operations involving megasonic transducers, mechanical brush scrubbers, laser cleaners and CMP equipment. The electropurge process is primarily intended for Fab plants where large wafers with a diameter of 200 to 400 mm require 250 to 350 steps including many dry layering, patterning and doping operations and at least 30 wet processing steps.

5 Claims, 3 Drawing Sheets

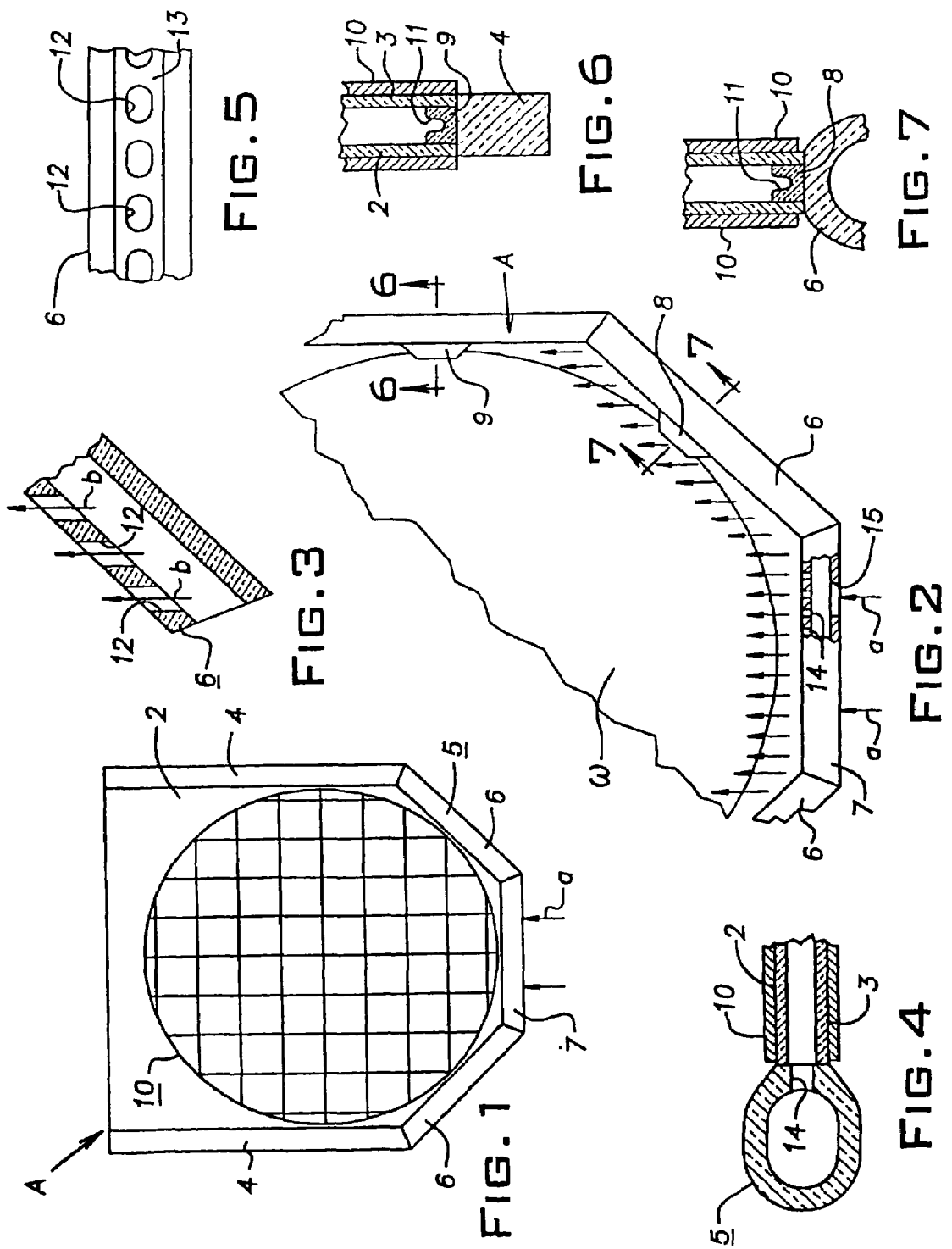

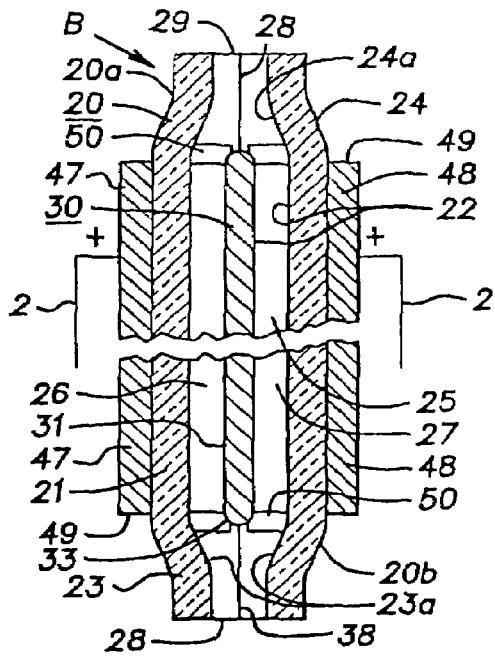
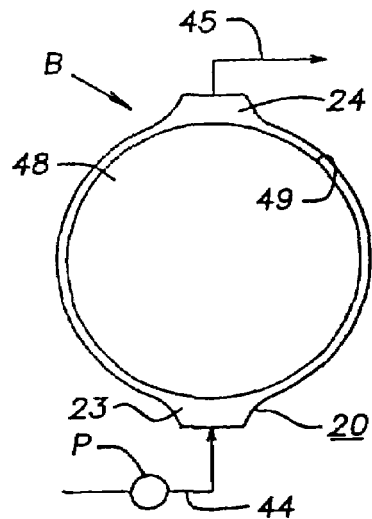
FIG. 8
FIG. 9
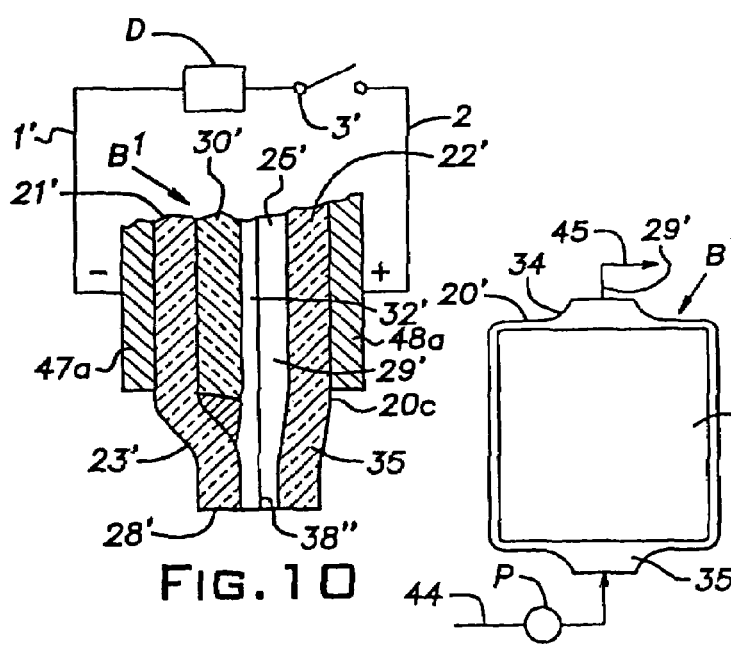
FIG. 10
FIG. 11
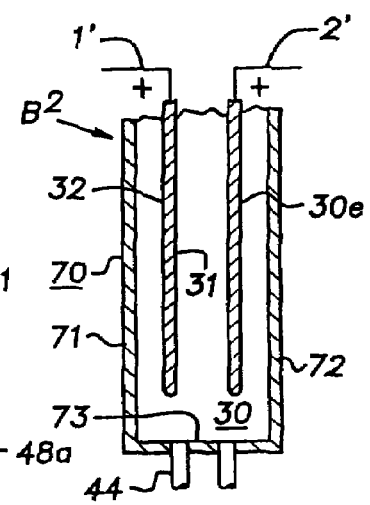
FIG. 12

APP 4

PROCESS AND APPARATUS FOR CLEANING SILICON WAFERS

This application is a continuation-in-part of copending application Ser. No. 09/490,162 filed Jan. 22, 2000, and claims the benefit of provisional application Ser. No. 60/116,940 filed on Jan. 23, 1999.

The invention as shown and described herein relates to processes and apparatus for cleaning semiconductor wafers in the manufacture of microprocessors, integrated circuits, and other sophisticated electronic devices. The invention relates to a cleaning system that can remove or substantially eliminate sub 0.1 micron particles during the fabrication and processing of semi-conductor wafers.

One embodiment of the invention relates to a cleaning apparatus comprising a special shaped receptacle designed for a single silicon wafer and having generally flat vertical walls parallel to the wafer.

Another embodiment of the invention relates to a process and apparatus for wet cleaning of silicon wafers wherein at least twenty wafers are supported in a wafer carrier and electrically charged by induction to provide an effective field intensity during wet processing.

The invention may seem simple in retrospect but is revolutionary in nature because it provides solutions to boundary layer problems that have mystified and plagued the semiconductor industry for decades. It involves a breakthrough in wet processing technology that should have tremendous value in the manufacture of the most advanced microchip devices.

BACKGROUND OF THE INVENTION

The RCA Standard Clean developed by Werner Kern and other RCA scientists in the late 60's is extremely effective in removing contamination from silicon surfaces of semiconductor wafers and is today and has been the defacto industry standard for more than a quarter of a century.

The rapid progress in the semiconductor industry, due in large part to the effectiveness of RCA clean (i.e., SC1/SC2), is described in detail in Werner Kern's 1993 book "Handbook of Semiconductor Wafer Cleaning" (680 pages). This progress is also discussed in "Microchip Fabrication: A Practical Guide to Semiconductor Processing" (Second Edition, 1990) by Peter Van Zant.

Unless the context or logic suggests otherwise, the terminology, abbreviations and/or jargon employed herein is intended to have a meaning consistent with the usage set forth in these Kern and Van Zant books as would be understood by those skilled in the semiconductor art.

The industry reduced the circuit image size (also known as the line width or feature size) from 0.35 micron (mm) to 0.25 micron about five years ago. The leading industry group SEMATECH, has set forth a detailed proposal for the 0.25 Micron Process which calls for around 360 process steps including more than 50 wet cleans. The detailed specifications (Steps 1 to 362) are set forth on pages B-3 to B-14 of the special printed SEMATECH publication, Technology Transfer No. 95042802-ENG. A large number of cleaning steps involve SC1, SC2 or other RCA clean features, most or all of which could be modified in accordance with my invention to permit effective removal of extremely small or colloidal-size silica particles with a diameter of 0.05 to 0.1 micron or less which cannot be removed with current technology.

The 360-step wafer fabrication process described above involves only four basic operations. They are (1) layering, (2) patterning, (3) doping, and (4) heat treatments. A detailed overview of the wafer-fabrication process is set forth in Chapter 5 of the 1990 Van Zant book which is incorporated herein by reference. Pages 95 to 99 describe 11 basic steps employed in the formation of an MOS metal-gate transistor structure.

Cleaning steps 175, 212, 248, 284, and 320 of the aforesaid 362-step fabrication scheme shown on pages B-3 to B-14, described as Clean Post CMP, are critically important and pose a difficult problem.

This year the advanced microchips have a circuit image size (also known as the line width or feature size) in the range of from 0.06 to 0.09 micron where particles with a minute size, such as 0.01 to 0.03 micron can be ruinous.

Prior to the invention, proposed improvements in wet cleaning and dry cleaning techniques offered no real hope of eliminating significant contamination by sub 0.1 micron silica particles. Therefore, killer defects were expected and could prevent the semiconductor industry from achieving its optimistic defect goals for high volume manufacturing. The national SEMATECH road map has set forth model defect density (and, by inference, yield) requirements by technology generation. Table 1 is a portion of such road map related to defect density goals.

TABLE 1

| Defect Goal Trends | | | | | | | | |
|---|---|---|---|---|---|---|---|---|
| DRAM equiv. | 16 Mb | | 64 Mb | | 256 Mb | | 1 Gb | |
| Min. dimension | 0.50 μm | | 0.35 μm | | 0.25 μm | | 0.18 μm | |
| Defects/cm² (% Yield) | 0.1 (87%) | | 0.05 (90%) | | 0.03 (90%) | | 0.01 (95%) | |
| | # of defects | defect size | # of defects | defect size | # of defects | defect size | # of defects | defect size |
| Killer defects per 200 mm wafer* | 28 | 0.10 μm | 14 | 0.07 μm | 9 | 0.05 μm | 3 | 0.03 μm |

In recent years chemical-mechanical planarization (CMP), makes it possible to employ smaller and smaller line widths. Unfortunately CMP involves colloidal polishing that tends to promote excessive contamination with particles of aluminum oxide, silica and the like.

In today's submicron integrated circuit technology, 0.05-micron-diameter particles can be major sources of circuit failure. Particles as small as 0.02 to 0.03 micron are now becoming major problems.

SUMMARY OF THE INVENTION

The present invention relates to unique processes and apparatus for wet processing of semiconductor wafers in which the wafers are electrically charged and more particularly to a special wafer cleaning system that is effective in removing colloidal- or sub 0.1-micron size particles that cannot be removed effectively by any known prior-art process.

The RCA-type wafer cleaning methods that have been standard in the semiconductor industry for more than a quarter of a century have been improved substantially during the last decade by use of megasonic transducer means, mechanical scrubbers or other means that helps dislodge and remove the contaminating particles. Strong or violent agitation has been provided by rotating brushes, sonic energy beams, laser beams, water jets and/or other suitable impact means. Such wet-processing techniques have made possible effective removal of contaminants with a particle size less than 0.2 micron. Improved megasonic cleaning means can remove particles as small as 0.15 micron. However, wet cleaning techniques of the type mentioned above with the latest improvements may not be effective in the future in removing contaminants with a particle size below 0.05 micron.

Heretofore the semiconductor industry was convinced that wet cleaning methods would never be effective in removing adhered colloidal-size contaminant particles. The best scientific minds grappling with the problem assumed, with good reason, that the tremendous van der Waals adhesive forces acting on colloidal-size particles at the wafer surface could not be overcome and that elimination of such particles by a simple wet cleaning operation was virtually impossible. The experts were convinced that the only real hope for success was a breakthrough or major improvement in dry wafer cleaning technology, perhaps a sophisticated laser technique.

The present invention provides the needed breakthrough and eliminates the need for a drastic switch from the usual wet cleaning systems to a unique dry system. It involves the amazing discovery that colloidal-size particles bonded to a wafer surface containing delicate microcircuits can easily be removed and repelled when the wafer is negatively charged in a suitable manner by applying a relatively small or limited voltage, such as 2 to 60 volts or more, insufficient to damage or degrade vulnerable portions of the microcircuits or significantly reduce the yield of top-quality microchips.

The process and apparatus of the present invention are designed for use in the fabrication of microelectronic devices on semiconductor wafers where delicate microcircuits are formed on the front face of the wafer by 250 to 350 steps or more including many layering, patterning and doping operations and a large number of wet processing steps. The preferred process of this invention is characterized in that the front face of each process wafer is provided with a suitable negative electric charge, such as 4 volts to 40 volts or more during wet processing and an effective field intensity, such as 0.02 volts or more per millimeter, sufficient to dislodge and remove colloidal-size or sub 0.05-micron particles.

The provision of an electric charge on each wafer in accordance with this invention is appropriate for batch-type wet processing operations, for example, in which 20 to 40 or more silicon wafers are treated simultaneously in one wafer carrier or cassette (e.g., see FIGS. 13 and 14) and also for other operations where the wafers are treated one at a time. The invention is particularly well suited to water rinsing operations and to RCA-type wet cleaning operations including those with special modified sequences as mentioned in U.S. Pat. Nos. 5,637,151 and 5,679,171, for example.

In carrying out the electropurge wafer cleaning process of this invention, it may be advantageous to employ megasonic transducer means for directing sonic pressure waves in a direction generally parallel to the face of each wafer thereby enhancing particle removal. In some applications it may also be appropriate or desirable to provide means for rotating the wafer(s) during wet processing.

Major advantages of the present invention can be obtained when using the preferred embodiment wherein a single wafer is subjected to wet processing in a flattened receptacle as in FIGS. 1 to 7 hereof. For example, a quartz glass receptacle, A, can be provided with a narrow internal cavity (e.g. of a size to receive one 200 mm, 300 mm or 400 mm wafer) having flat parallel glass wall spaced a short distance from the flat wafer faces. An aqueous solution or DI water would be caused to flow from the bottom to the top of the receptacle while the surface of the wafer was electrically charged. A desired negative charge is preferably induced by employing a positively charged metal plate, layer or coating at the flat outer surfaces of the receptacle as shown in FIGS. 6 and 7, for example.

One wet cleaning operation commonly involves RCA-type wet cleans with acid and alkaline treatments and a plurality of DI water rinses followed by IPA drying, spin drying or other final drying step. During all or most of the wet cleaning operations, the silicon wafer can be electrically charged in accordance with the present invention to a predetermined limited voltage, such as 10 to 60 volts. A higher voltage may sometimes be tolerable, but charging the face of the wafer to a higher voltage can be risky and is usually unnecessary or undesirable.

An excessive voltage is undesirable, if not foolish, because of possible adverse effects on quality, uniformity and process yields and the increased risk of degrading the more delicate portions of the microcircuits.

In the semiconductor industry, one of the current target goals in microchip fabrication is to reduce the defect density to less than 0.03 defects per square centimeter (See Table 1). An object of the present invention is to reach that goal in a simple and effective manner by substantially eliminating "killer particles" and minimizing the number of troublesome particles (e.g., those with a particle size more than 10 percent of the minimum line width or feature size) which are highly undesirable.

The term "killer defect" is used herein in the broad sense to cover an unacceptable or intolerable defect in the microelectronic circuits of a semiconductor device or microchip caused by a contaminant particle trapped or embedded in the device during the fabrication process. A defect can be considered intolerable or unacceptable if it degrades the electronic circuits substantially or to such a degree that the electronic device has limited utility or is unacceptable to most customers.

The term "killer defect" is used in a narrow sense in Table 1 on page 5 of this specification to describe trapped or embedded particles with a particle size that is at least about 20 percent of the minimum line width or feature size (identified in the table as "Min. dimension"). That table from the SEMATECH road map indicates that one of the goals is to obtain a 90-percent yield of advanced (0.25 um) wafers with no more than 0.03 killer defects per square centimeter.

The term "killer defect", when used herein in the narrower sense, does not include colloidal-size particles with a size of 0.01 micron or less and does not cover very small microscopic particles (e.g., those with a particle size of from about 5 to about 10 percent of the minimum line width) that are highly undesirable and could affect the quality, reliability and useful life of the device.

Wafer Cleaning Technology

Surface contamination is considered to be a major problem in the semiconductor, aerospace, and pharmaceutical industries. The adhesion of contaminants to silicon substrates is largely responsible for the yield loss in the manufacturing of VLSI and ULSI devices. Many methods for removing particles from silicon surfaces are currently used but the most common techniques are the wet chemical processes based on the hydrogen peroxide/ammonium hydroxide mixtures (SC1 or APM). The addition of megasonic energy during these processes has been proven to enhance particle removal.

Historically, SC-1 solutions were based on highly concentrated mixtures of ultrapure de-ionized water (DIW), ammonium hydroxide ($NH_4OH$), and hydrogen peroxide ($H_2O_2$), in a volume ratio of 5:1:1 (5 DIW: 1 $H_2O_2$: 1 $NH_4OH$). Typically; wafers are immersed in these cleaning baths at 70-85° C. for 10 minutes. Higher temperatures are not recommended in order to minimize thermal decomposition of hydrogen peroxide and evaporation of ammonium hydroxide. Wafer rinsing in DI water is usually conducted in intermediate and final steps.

During a SC-1 cleaning process, a cooperative and compensating action exists between the two chemical components. $H_2O_2$ oxidizes the silicon and forms a chemical oxide; the formation of this oxide is limited by the diffusion of the oxidizing species. Ammonium hydroxide, conversely, slowly etches this chemically grown oxide. The result of these two processes is that a chemical oxide layer will continually be generated and removed. Particles are thus removed by this etching and undercutting action. Particle removal efficiency can be increased by increasing the etch rate of $SiO_2$. The etch rate, in turn, can be increased by using greater concentrations of $NH_4OH$ or by elevating the process temperature.

The continually increasing integration of advanced IC manufacturing requires tighter process control and specifications. In addition, more stringent environmental requirements are being mandated to reduce chemical and water consumption and waste. The use of megasonic energy has been applied to many wafer surface cleaning procedures as a means to enhance particle removal, reduce chemical concentrations, and shorten process times. The acoustic waves needed for cleaning are generated from piezoelectric transducers.

The RCA Standard Clean, developed by W. Kern and D. Puotinen in 1965 and disclosed in 1970[1] is extremely effective at removing contamination from silicon surfaces and is the defacto industry standard [2]. The RCA clean usually consists of two sequential steps: the Standard Clean 1 (SC-1) followed by the Standard Clean 2 (SC-2). The SC-1 solution, consisting of a mixture of ammonium-hydroxide, hydrogen-peroxide, and water, is a most efficient particle removing agent.

Wafer rinse stages are an integral part of the chemical processes necessary in semiconductor device manufacturing. As an important stage in an integrated process, rinsing plays a central role in device yield, cost of ownership and environmental issues which continue to have increasing importance for the semiconductor industry. Because of these considerations, there are significant benefits to developing optimized rinsing processes, including better device performance, reduced water consumption, shorter cycle times, higher tool utilization and higher throughputs—all leading to lower cost of ownership.

Frequent wet cleans are essential during wafer processing to achieve satisfactory yields. In the 362-step manufacturing process previously described, more than 50 wet cleans would be employed. Wet benches are commonly used for wet cleaning operations and may employ robotic means for automatically advancing silicon wafers 25 to 40 at a time from one station to the next. A wet-bench set up is illustrated, for example, on page 138 of Kern's 1993 handbook.

When using RCA standard cleans (SC-1 and SC-2), a typical wet bench includes 5 or 7 recirculation immersion tanks, such as the tank shown in U.S. Pat. No. 5,520,205, in which liquid is continuously pumped into the bottom of the tank and caused to overflow. Liquid cleaning, rinsing and drying steps in a typical wafer processing sequence (MOS gate oxidation) are shown by cross hatching in FIG. 3 (Kern page 281). A 5-tank wet bench could, for example, start with an HF strip and DI rinse followed by SC-1, DI rinse, SC-2 and DI rinse. Megasonic cleaning means would typically be used in the SC-1 bath but could also be used in the SC-2 bath and/or the rinse baths. A 7-tank wet bench could include a final HF bath followed by another DI rinse.

Needless to say, very large amounts of deionized (DI) water are required for the typical cleaning system. The water is extremely pure with a typical resistivity of 18 mega ohms. The DI water is usually dumped after use but can sometimes be cleaned and recirculated.

A 5-tank or 7-tank wet bench of the type described above could, for example, be employed for each of the wet clean steps 2, 5, 23, 35, 37, 63, 68, 70 and 108 of the 362-step manufacturing process previously described. It will be understood that the semiconductor wafers being processed must be dried at the conclusion of each wet clean before the next dry process step. A spin rinse dryer or IPA dryer is commonly used for this purpose.

The specific 362-step fabrication process of the SEMATECH publication, pages B-3 to B-14 includes the lithographic (patterning-doping) sequence of described steps 14-22 and seven other lithographic sequences 25-34, 72-81, 82-92, 110-118, 119-128, 135-143 and 144-153 that are basically the same as the sequence 14-22, except for added inspection steps 31, 87, 124 and 149. Note also that there are slight differences at the ion implantation steps 78, 79, 89 and 90. Two other lithographic sequences 41-51 and 178-187 are quite similar but omit the implant step (20) and include added etching steps 48, 49 and 185.

The aforesaid fabrication process also includes the previously described layering-patterning sequences 195-204 and 214-224 involving metal or oxide deposits, steps 195 and 214, and chemical-mechanical polishing, step 211. It also includes three sequences 233-242, 269-278 and 335-344 that are basically the same as the described sequence 195-204 and three sequences 247-260, 283-296 and 314-331 that are basically the same as the described sequence 211-224.

The 362-step fabrication process includes more than 50 wet cleaning or wet processing operations that can be modified and improved in accordance with my invention as by inducing a substantial electric charge in each silicon wafer. These include eleven RCA-type wet cleaning operations (such as described steps 2, 5 and 23) including steps 35, 37, 63, 68, 70, 108, 129 and 154; four HF cleans, steps 65, 93, 103 and 133; five post CMP cleans, (such as described step 212) including steps 175, 248, 284 and 320; nine NMP cleans (such as described step 209) including steps 227, 245, 263, 281, 299, 317, 334 and 347; ten resist-strip with NMP (such as described steps 204 and 224) including steps 242, 260, 278, 296, 331, 344, 356 and 362 and fourteen resist-strip with $H_2SO_4$ (such as described steps 13 and 22) including steps 34, 51, 62, 81, 92, 105, 118, 128, 143, 153, 161 and 187.

Proposed Laser-Boil Cleaning System

In recent years a hybrid laser cleaning system has been proposed for use in cleaning semiconductor wafers. In this system a wafer is wetted and covered with a water film. A laser beam directed against the liquid film causes violent localized boiling that helps remove particulate contamination.

Planarization and Post CMP Cleaning

Successful mass production of the advanced microchips used in today's computers became possible because of the development of a number of planarization techniques used to offset the effects of varied wafer topography. The techniques of multilayer resist processing, planarization layers, reflow, and chemical-mechanical polishing (CMP) are collectively known as planarization techniques.

The planarization methods do not guarantee an absolutely flat wafer surface ideally suited for subsequent lithographic operations. The only process that provides a global planarization of an entire wafer face is CMP, the same basic process used to flatten and polish the wafers sliced from the silicon crystal after crystal growing. Unfortunately the abrasive material used for polishing (i.e., silica or aluminum oxide) creates a major particulate contamination problem.

In a typical CMP polishing operation the wafers are mounted upside down on a holder and rotated in the other direction as in the SpeedFam CMP-V system shown and described in "Semiconductor International", May 1993 (FIG. 10.16 of the 1993 article is a picture). An alkaline slurry of silica (glass) or aluminum oxide suspended in a mild etchant, such as potassium or ammonium hydroxide, is caused to flow between the wafer and the polishing pad.

The removal of particulate contaminants from semiconductor wafers during post CMP cleaning operations is a most difficult and perhaps the most important of all wet processing operations in the fabrication of advanced microchips.

At the present time mechanical wafer surface scrubbers are considered the most practical when particulate removal is critical as in post CMP processing. The scrubbers usually hold the wafer on a rotating vacuum chuck. While being firmly held, a rotating brush is brought in near contact with the rotating wafer while a stream of deionized water (often with a detergent) is directed onto the wafer surface. This creates a high-energy cleaning action at the wafer surface. The liquid is forced into a small space between the wafer surface and the brush ends where it achieves a high velocity, which improves the cleaning action.

For the last 30 years the most competent scientists have been convinced that the primary force binding a colloidal-size particle to a wafer surface is van der Waals attraction which is universal and dominating when separation distances between a particle and a surface are extremely small (e.g., below 5 nanometers). The forces of attraction increase as the particle size decreases so that it appears virtually impossible to overcome the van der Waals forces when the particle size is 0.01 micron or less.

On this basis foremost experts, such as Werner Kern, concluded that wet cleaning processes could not provide a satisfactory way to remove colloidal-size particles when manufacturing the most advanced microchips and that new dry methods would have to be developed.

Attempts were made to improve the effectiveness of wet wafer cleaning processes by causing strong or violent agitation of the liquid as by providing concentrated bursts of energy from lasers or megasonic transducers or by providing continuous mechanical agitation by rotating scrub brushes.

However, such methods were not expected to be adequate for removal of sub 0.05-micron particles. Heretofore, more sophisticated dry cleaning methods seemed to provide the only real hope for minimizing particulate contamination when manufacturing advanced microprocessors with a minimum feature size or line width of 0.15 micron or less.

The universally accepted theories of the best scientific minds have turned out to be major impediments to progress in the wafer cleaning field. The present invention demonstrates serious flaws in those theories, particularly with respect to the nature and importance of van der Waals forces. Prior to the invention, the semiconductor industry had no reason to suspect that simple electrical equipment could provide a tremendous improvement in the effectiveness of wet cleaning processes.

DEFINITIONS AND TERMINOLOGY

The language used in the present disclosure should present no problem to persons skilled in the art of which the present invention pertains. The language should be construed in a reasonable and logical manner consistent with the context and normal usage in the art. Generally the technical terms and jargon can be construed to be consistent with the language or terminology employed in the textbook "Microchip Fabrication" (3rd Edition, 1997) by Peter Van Zant.

For example the terms angstrom, wafer boat, capacitor, CMP, CVD, CUM yield, DI water, die, dopant, DRAM, feature size, integrated circuit, ion implantation, killer defect, layering, lithograph, LSI, patterning, passivation, photoresist, quartz, RTP, rinse, ULSI, VLSI, wafer and yield are defined briefly in the Glossary (pages 587 to 605) of said textbook.

The term "feature size." or "line width" is used herein in the usual sense to indicate the minimum width of pattern openings or spaces in a microelectronic device or microchip.

The term "megasonic" is used herein to describe energy waves generated from piezoelectric transducers in the 750- to 1500-kilohertz (kHz) range.

The term "field intensity" indicates the strength of an electric field. An "effective field intensity" as used herein is at least about 0.01 volts per millimeter.

The term "charge density" indicates the degree of charge or current-carrier concentration in a region (e.g., coulombs/$cm^2$).

The term "electrode" is used herein to describe a silicon plate or wafer or a similar metal or metal-coated plate or device that can be electrically charged and employed to induce or create an electrical charge in a process wafer in accordance with the present invention.

A DC power source or power supply can be a direct current generator or battery or other source, such as a transformer-rectifier-filter arrangement.

The terminology used in the patent claims hereof should be construed in a reasonable manner in the light of the description and common usage. Unless the context suggests otherwise the terms are intended to be broad in scope rather than to have an unnecessary limited meaning.

Unless the context or common sense shows otherwise parts or percentages are by weight rather than by volume.

DESCRIPTION OF THE DRAWINGS

FIG. 1 is a front elevational view on a reduced scale showing a unique wafer cleaning means A in the form of a flattened quartz glass receptacle 10 having a narrow internal cavity that receives a single semiconductor wafer w;

FIG. 2 is a fragmentary elevational view on a larger scale with the flat front wall 2 of the receptacle omitted and a portion of the marginal tube being shown in section, the vertical flow of liquid from the tube 5 being shown by the arrows;

FIG. 3 is an enlarged fragmentary sectional view of the inclined tube portion 6;

FIG. 4 is an enlarged fragmentary sectional view of the marginal tube 5;

FIG. 5 is a fragmentary top view of tube portion 6;

FIG. 6 is an enlarged fragmentary sectional view taken on the line 6-6 of FIG. 2;

FIG. 7 is an enlarged fragmentary sectional view similar to FIG. 4 but taken on the line 7-7 of FIG. 2;

FIGS. 8 to 12 are schematic views illustrating modified forms of apparatus that could be employed in the practice of this invention;

FIG. 8 is a schematic foreshortened vertical sectional view on an enlarged scale showing a modified form of split glass receptacle (20) which may be opened for insertion or removal of the wafer;

FIG. 9 is a schematic side elevational view of the receptacle (20) on a reduced scale;

FIG. 10 is an enlarged fragmentary vertical sectional view similar to FIG. 8 showing a modified glass receptacle suitable for wet cleaning of flat panel displays and/or field emission displays and including electrical means for charging the panel or wafer;

FIG. 11 is a side view of the receptacle of FIG. 10 similar to FIG. 9;

FIG. 12 is a schematic vertical sectional view showing another modified form of wafer cleaning apparatus.

DESCRIPTION OF PREFERRED EMBODIMENTS

Figure 14:
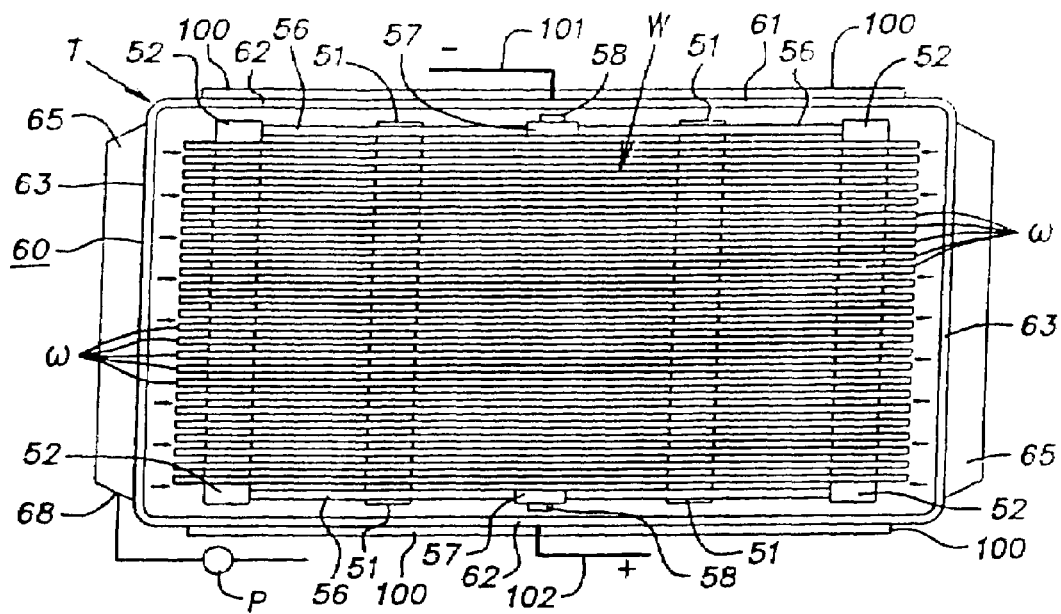
FIG. 14 is a schematic top view of the cleaning apparatus of FIG. 13 on the same reduced scale.

One of the embodiments of the present invention is illustrated in FIGS. 1 to 7 and employs a flattened wafer holder and receptacle 10 designed to receive a single semiconductor wafer w. This embodiment and other embodiments of a similar nature using single-wafer receptacles or the like are believed well suited for modern fabrication systems, particularly those that employ silicon wafers with diameters of 200 mm or more. When smaller wafers are employed, it may be preferable to employ other embodiments of this invention wherein 20 to 40 or more wafers mounted on a wafer carrier or cassette are cleaned and rinsed while being electrically charged.

Such wet-batch cleaning apparatus (e.g., of the type shown in FIGS. 13 and 14) or a single-wafer apparatus (e.g., of the type shown in FIGS. 1 and 2) can be modified using sonic energy, laser energy, scrubbing means or other means which may be appropriate in some applications. Modified versions of the apparatus can, for example, include megasonic transducer means for directing sonic pressure waves in a direction generally parallel to the wafer face (e.g., see U.S. Pat. Nos. 4,869,278; 4,998,549 and 5,037,481).

FIGS. 1 to 7 illustrate an embodiment of the present invention wherein a wafer carrier formed of glass, silicon or other suitable material has a narrow internal cavity that receives a single silicon semiconductor wafer and has means for charging the wafer to a small voltage during wet processing operations. These figures provide a simple schematic illustration of apparatus particularly well suited for use in the practice of the invention and are intended to facilitate a ready understanding of the invention and the various ways the apparatus can be used in a high-tech microchip fabrication plant, for example in a typical 300-plus step manufacturing process that involves 40 to 50 or more wet processing steps.

While these drawings are to some extent schematic and omit features which may be considered valuable or important, they include the basic elements needed for practice of the invention and are drawn substantially to scale to provide an example of a simple quartz glass receptacle that would be suitable for commercial use as is or with simple modifications but probably would be improved greatly before use by a large manufacturer.

As shown, a wafer carrier A is provided in the form of an open-top quartz glass receptacle with top surfaces 1 and a pair of identical parallel flat glass walls 2 and 3 preferably spaced apart a distance of several millimeters, usually at least twice the thickness of the silicon wafer. The front and rear glass walls have flat vertical surfaces at opposite sides that are welded to the flat surfaces of straight vertical side bars 4 of rectangular cross section.

A quartz glass tube assembly 5 of semihexagonal shape is welded to the lower margins of the plates 2 and 3 which have an identical semihexagonal shape. It will be understood, of course, that the assembly 5 and the plates 2 and 3 could be semicircular, if desired, to conform more closely to the shape of the circular semiconductor wafer w. A modern wafer used for manufacture of advanced microchips can have a diameter of 200 to 400 millimeters.

The glass tube assembly 5 has two oppositely inclined straight portions 6 welded to a straight horizontal portion 7. The flat surface 13 of tube portion 6 is welded to the flat inclined bottom surfaces of the plates 2 and 3 at opposite sides of a row of regularly spaced vertical openings 12 that direct liquid vertically in the direction of the arrows b (FIG. 3). The horizontal tube portion 7 has a similar flat upper surface welded to the flat horizontal bottom surfaces of plates 2 and 3 on opposite sides of a row of closely spaced vertical openings 14 as shown in FIG. 4. The tube sections 6 and 7 can have the same cross section throughout the length of tube assembly 5 so as to provide an unobstructed passage for flow of liquid between the two side bars 4 and access to all of the multiplicity of openings 12 and 14.

The liquid pumped into the bottom inlet openings 15 of tube portion 7 as indicated by the arrows a is directed vertically from those openings at a multiplicity of regularly or closely spaced locations as indicated by a multiplicity of vertical arrows in FIG. 2. The water or cleaning liquid can be pressurized by the pump P, as in the embodiment of FIGS. 8 and 9, and caused to flow rapidly from the openings 12 and 14 as water jets or separate vertical streams, but this is not essential. The tube assembly 5 is designed to provide substantially uniform upward flow of liquid across the full diameter of the wafer so that laminar flow will occur and unwanted eddy currents will be minimized or substantially eliminated. This assures rapid removal of all chemicals when changing from an acid to an alkaline wash or vice versa or changing to a DI water rinse.

The glass receptacle A of FIGS. 1 and 2 is open at the top edge 1 to permit vertical movement of the wafer w into and out of the narrow internal cavity 16 defined by the flat glass walls 2 and 3 and the marginal members 4, 6 and 7 (The large top opening is unnecessary in the embodiment of FIGS. 8 and 9 because the receptacle is split in half). The top edge portion at 1 provides a weir for overflow of liquid and can be flat or serrated. If the liquid overflows into a tank it can be filtered and recirculated, if desired.

Means are provided for holding and supporting a single semiconductor wafer in a vertical position midway between and parallel to the glass walls 2 and 3. If desired such means can be designed to permit or facilitate rotation of the wafer during the cleaning operation. As shown such means comprises a plurality (e.g., 3 to 5 or more) of wafer guide means 8 and 9 welded to or adhered to the marginal means 4, 6 or 7 and having grooves 11 that received and substantially fit the rounded circumferential edge portion of the wafer w. Such grooves can be shaped to maintain each wafer in the desired vertical position and can permit rotation of the wafer as by water pressure, sonic energy or mechanical means (e.g., see U.S. Pat. Nos. 5,286,657 and 5,698,038).

In the practice of the present invention electrically-conductive plates, layers or coatings are provided at or near the surface of the glass receptacle to permit charging of the wafers and thereby effect removal of submicron particles adhering to the wafer surface. If a conductive metal coating is employed, it is preferably applied at the outer surface of the plate 2 or 3. However, a layer or coating of silicon metal could be employed at the inner surface. In fact the plates 2 and 3 could be formed of silicon metal to minimize the distance from the charged plate to the wafer surface, thereby increasing the field intensity at a given voltage.

As shown herein a flat conductive metal charge plate or electrode 10 is mounted on the flat outer face of each plate 2 and 3. The plate is circular and has a diameter at least equal to and not substantially less than that of the wafer w, but other shapes and sizes may be appropriate or acceptable (e.g., when the wafer is rotated).

In order to obtain the desired uniformity it is desirable to divide the charge plate 10 or other charging means into a large number of sections so that independent computer control of the electric charge can be provided for each section. As shown the plate 10 is divided into more than 50 square sections to permit such computerized control of the charge density at each section.

In one embodiment of my invention, purging or cleaning of a semiconductor wafer can be carried out using wet cleaning means B of the type shown in FIGS. 8 and 9 comprising a flattened wafer holder and receptacle 20 formed of high-purity quartz glass having parallel flat circular wall portions 21 and 22 of uniform thickness and integral bottom and top portions 23 and 24 suitably connected to bottom inlet and top outlet pipes 44 and 45. A pump P is provided to cause the desired upward flow of DI rinse water or an aqueous cleaning solution through the receptacle 20.

The receptacle 20 can be split to form two halves 20*a* and 20*b* that fit together to form an airtight or watertight seal at the vertical split line 38. Optionally the receptacle may be divided into upper and lower sections with a seal at a horizontal split line. Suitable means may be provided to clamp or hold the two halves of the receptacle together and to maintain the desired seal. For example, some type of releasable clamping or holding means 39 can be provided to hold the halves 20*a* and 20*b* together during the wet cleaning operation and perhaps during a subsequent spin drying operation. Optionally, a series of very small glass projections or spacers 50 or other suitable holding means can be provided to locate or hold the wafer 30 or to hold it in a fixed position.

The unique quartz glass receptacle 20 is shaped to provide a shallow flat circular cavity 25 of uniform width with very shallow portions 26 and 27 of narrow cross section and uniform width at the opposite faces 31 and 32 of the wafer. Optionally the receptacle can be formed in one piece or welded to join opposite halves, but this would require a narrow slot or opening at the top to permit a wafer to be lowered into and raised out of the cavity 25. Robotic means could be provided to lower, raise, and/or hold the wafer during wet cleaning and drying.

The cavity 25 of the receptacle 20 is shaped to assure laminar flow of liquid over the flat front and rear surfaces 31 and 32 of the silicon wafer 30, whose circular marginal surface 33 is preferably rounded. The wafer may, of course, have a notch or flat portion at the margin to assure proper positioning during manufacture. The inlet and outlet portions 23 and 24 of the glass receptacle are provided with smooth curved surfaces 23*a* and 24*a*, respectively, shaped to assure laminar flow free of eddy currents or turbulence as the aqueous liquid flows into or out of the narrow cavity 25.

The cavity 25 is shown as being generally circular and can have a uniform horizontal width preferably from about 2 to about 5 times the thickness (or horizontal width) of the silicon wafer 30 (e.g., a conventional 200 mm or 300 mm wafer). As shown the cavity width may be 3 or 4 times the wafer thickness so that the narrow spaces 26 and 27 between the wafer surfaces 31 and 32 and the glass surfaces 21*a* and 22*a* have a width of only a few millimeters, typically about 2 to 4 millimeters. The thickness of the vertical wall portions 21 and 22 is usually from about 2 to about 5 mm.

Figure 13:
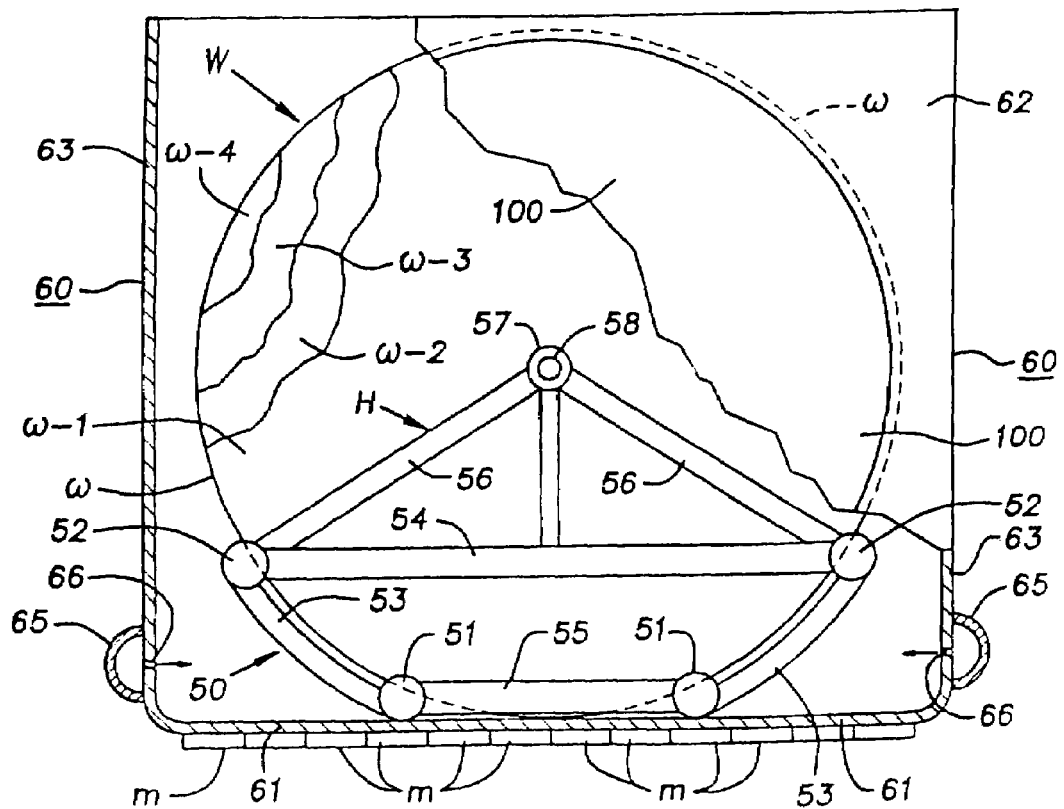
FIG. 13 is a schematic side elevational view drawn substantially to scale with parts broken away and parts in section showing a preferred embodiment of the invention wherein 25 silicon wafers are electrically charged in a tank during wet cleaning.

The RCA clean system (SC-1 and SC-2, etc.) or a similar system suitable for modern wafer cleaning is preferred when carrying out the process of my invention using the single-wafer glass receptacle and also in the embodiment of FIGS. 13 and 14. The efficiency in removing submicron particles can, of course, be improved by employing megasonic energy. For example, optional megasonic cleaning means can be provided with an array of piezoelectric transducers near the outer marginal portions of the wafer 30 (at 60, FIG. 9). Such means is located to cause the sonic pressure waves to travel through the liquid (from location 60) in a direction parallel to the vertical wafer surface. The impact of these pressure waves on contaminating particles with a diameter greater than 0.1 micron may be sufficient to dislodge them, but may not be effective in removing smaller particles. Megasonic cleaning means are disclosed, for example, in Verteq U.S. Pat. No. 4,869,278; 4,998,549 and 5,037,481 and 5,286,657.

The wafer cleaning apparatus B of. FIGS. 8 and 9 is designed to receive flat discs or wafers 30 of circular shape but could be modified as in FIG. 11 for wet cleaning of rectangular discs or wafers with or without the use of megasonic energy (at 60). The wet cleaning process and apparatus of my invention was designed primarily for use during the manufacture of microchips from circular silicon wafers, but is also important for use during the manufacture of rectangular flat panel displays (FPDs) and field emission displays (FEDs). The majority of FPDs are the color-active matrix liquid-crystal displays (AMLCD) most often seen as laptop computer screens.

Both color and noncolor LCD displays are manufactured using microchip-fabrication technology comparable to that described herein. However, the microelectronic devices, transistors, etc. are formed on relatively large rectangular glass plates rather than on a silicon wafer. The typical glass plate of an FPD has a width of at least one foot (300 mm) and is a borosilicate glass. Unlike a silicon wafer, the glass plate (e.g., plate 30') is nonconductive and cannot readily be charged by induction like the silicon wafer 30 of FIG. 1. For this reason it is desirable to employ apparatus of a type specially designed for cleaning the rectangular FPD plate as shown in FIG. 10, for example.

The cleaning means B' of FIGS. 10 and 11 is generally equivalent to the apparatus B of FIGS. 1 and 2 (except for the location of the glass plate 30' against or almost in contact with the flat wall portion 21' of the quartz glass receptacle 20') and is used in the same way (e.g., with the RCA clean sequences).

As shown the cleaning means A comprises a flattened quartz glass receptacle 20' having flat wall portions 21' and 22' of uniform thickness and integral curved bottom and top portions connected to inlet and outlet pipes 44 and 45. The receptacle is formed in two (non-symmetrical) halves that fit together at the vertical split line 38' to form an air-tight or liquid-tight seal throughout the periphery of the narrow cavity 25'. The portion 27' of that cavity between wall portion 22' and plate 30' has a horizontal width that is usually no more than 3 or 4 millimeters and may, for example, be the same as that of the cavity portion 27 of FIG. 8 so as to function in the same way.

The shape of the two-piece glass receptacle 20' differs from that of receptacle 20 at the inlet and outlet ends 28' and 29'. In FIG. 10, the upper and lower portions 34 and 35 of the front half (20c) of the receptacle containing wall portion 22' is preferably symmetrical with only a slight curvature. In the rear half containing wall portion 21', the upper and lower portions are also symmetrical (as in FIG. 8) with a curvature (e.g., at 23') comparable to that of inlet and outlet portions 23 and 24, but the inner surface at the margin of glass plate 30' is shaped to fit the plate at its marginal edge. If desired the receptacle may be made to fit the flat narrow marginal faces of the glass plate (at 33'), thereby eliminating a marginal gap. However, as shown in FIG. 10, there is a marginal gap that's substantially filled with a narrow marginal strip 41 of generally triangular cross section. The strip extends around the entire periphery of the glass plate 30' to promote laminar flow of liquid and minimize unwanted eddy currents or the like. It can be rigid or flexible and can be formed of silicon, glass or other suitable materials.

In carrying out the process of the present invention, a small precision robot can be employed to pick up a single wafer 30 or a single FPD plate 30' and transfer it to a wet cleaning means B or B'. After the wafer or glass plate is placed in and securely located in the open half of the quartz glass receptacle 20 or 20', the receptacle is closed and held closed by clamping means or the like at 39 until the RCA or other cleaning sequence (or rinse) is completed.

The liquid flow provided by a water pump P or in other manner by a spray technique or vapor condensation is toward the outlet end from the inlet. The wafer 30 for example, can be in a substantially vertical position or in an inclined or horizontal position provided the flow is toward the outlet. If desired, one or more receptacles 20 can be spun about a vertical or horizontal axis at any desired speed to provide a centrifugal force on the liquid at the wafer surface. The desired movement of the water or other liquid over the wafer surface may be obtained with or without a pump P. It will also be understood that the DI water in the final rinse may be displaced with isopropyl alcohol prior to spin drying or other final drying operation.

The apparatus B of FIGS. 8 and 9, for example, is inexpensive and well suited for laboratory research. Apparatus of this type designed for research and development work in the field of wafer cleaning happens to be convenient for use in research involving electricity. The glass receptacle 20, for example, can easily be provided with a silver coating or other conducive metal coating (e.g., at 47 and 48) as part of an electrical circuit. The simple circuit shown in FIG. 10, for example, can easily be employed with the wet cleaning apparatus B or B' to apply a positive or negative charge.

That circuit includes a battery means or DC power source D with lines 1' and 2' connected to the negative and positive terminals, respectively, and an on-off switch 3'. The power source D can include means to adjust and measure the voltage or emf.

It has been discovered that inducing a charge in a silicon wafer, such as the wafer 30, by providing a limited voltage, such as 4 to 60 volts, at the metal plate 47 or 48, is effective to remove submicron particles from the wafer surface during microchip fabrication. A voltage insufficient to harm or damage a modern microchip with a line width of 0.15 micron can be sufficient to provide efficient removal of "killer" particles in the sub 0.1 micron range which heretofore could not be removed satisfactorily by any known wet cleaning method.

The embodiment of FIG. 12 includes a thin rectangular quartz-glass tank, vessel or receptacle and a plurality of permanently-mounted oxide-coated silicon wafers that serve as positive electrodes on opposite sides of each semiconductor wafer lowered into the vessel. If the vessel is designed to receive 2, 3 or 5 silicon semiconductor wafers (30), then the required number of positive silicon electrodes would, of course, be 3, 4 and 6, respectively. It could be feasible to clean 10 or 20 semiconductor wafers at a time in a tank 5 or 10 times the size of the one shown (which is designed to receive only one such wafer). However, the system illustrated in FIGS. 13 and 14 would be more appropriate.

In the apparatus of the embodiment of FIG. 12, DI water or other liquid is pumped into the bottom of the vessel and allowed to overflow at a weir or exit to an outlet pipe (not shown). The system could be fully automated. A small precision robot would pick up a single semiconductor wafer from a 25-wafer cassette or wafer carrier and insert this one wafer into the liquid bath midway between and parallel to the two outer positive-electrode silicon wafers.

The outer silicon-wafer electrodes can be connected in a suitable manner to the positive side of a power supply. They would be carefully and gradually charged to a positive emf of say 4 to 30 volts while the semiconductor wafer being processed is charged inductively to a comparable negative emf.

It may be preferable to employ silicon wafers as electrodes when they are immersed in the aqueous bath as shown. All of the silicon surfaces of such electrode wafers will be completely oxidized prior to use so that substantial electrolysis will not occur in the bath. Charging the silicon wafers by induction as in FIGS. 8 and 14 precludes destructive electrolysis.

FIGS. 13 and 14 illustrate a preferred embodiment of the present invention wherein wet processing operations are carried out while a row of 20 or more aligned, parallel, regularly spaced, vertically-oriented silicon wafers w is supported on a conventional type of wafer carrier or cassette. A suitable type of cassette having parallel slotted vertical side walls to hold a row of wafers is shown and described in U.S. Pat. No. 5,698,040 together with an overflow tank and associated equipment for circulating a cleaning liquid.

As shown, an array W of 25 aligned vertical wafers w is supported and held in position on a wafer carrier or holder H comprising a rigid assembly 50 of quartz glass rods or bars that are integrally connected, as by welding. The assembly includes a bottom pair of slotted circular rods 51, an upper pair of similar slotted rods 52, a series of regularly spaced curved support arms 53 connected between the rods 51 and 52 at opposite ends of the holder H, and a pair of horizontal connecting rods or bars 54 at opposite sides of the holder adjacent to the end wafers of the array W.

A shorter horizontal connecting rod or bar 55 extends between each pair of rods 51, and a pair of inclined rods or bars 56 are connected to the rods 52 and to a short circular lifting member 57+located near the end wafers of array W and the common horizontal axis of the 25 wafers. A small diameter stud portion 58 or similar means projecting outwardly from member 57 can be engaged by the lift hook of a robot to support the holder H and the wafer array W as they are raised or lowered.

The crude wafer holder H is not conventional and is shown for convenience of illustration, it being understood that additional means, such as the slotted vertical wall means of U.S. Pat. No. 5,698,040, can be employed to help locate the wafers and hold them in the desired vertical positions.

In FIG. 13, portions of the row of axially aligned wafers are broken away to expose the second wafer w-2 next to the end wafer w-1, the third wafer w-3, and the adjacent fourth wafer w-4. The rectangular vertical side wall 62 of the overflow tank T and the thin flat circular metal sheet forming the electrode or charge plate 100 are also broken away to show the wafer carrier H.

A substantially rectangular overflow vessel T formed of quartz glass or other suitable non-conductive material is provided to receive the wafer carrier and the 20 or more silicon wafers of the array W. The wafers may be standard 200 mm or 300 mm wafers. The vessel comprises a thin-wall tank 60 in the form of a box (which could be modified, if desired, to serve as a cassette) having a flat horizontal bottom wall 61, parallel flat vertical side walls 62, and similar vertical end walls 63. The top edge 64 of the tank 60 is higher than the top portions of the wafers so that the array can be completely submerged in the DI water or cleaning liquid filling the tank.

A pair of horizontal feed tubes 65 are welded to or attached to the end walls 63 near the bottom of the tank and have narrow horizontal slots 66 aligned with similar narrow slots 67 in those end-walls to facilitate rapid flow of liquid from the tube 65 to the interior of the tank. Each tube can have a single slot 66 with a length of 6 to 7 inches or more or a plurality of slots with a comparable total length, such as 6 inches or more. The same applies to the slot or slots 67 of the tank wall (e.g., a single slot 67 more than 6 inches long or perhaps three or more slots, each 2 inches long.

During normal wet cleaning operations, water or other liquid is fed to the inlet 68 of each to be 65 by a pump P or other suitable feed means. The liquid fills the tank 60 and continually overflows at the top edge 64.

Megasonic transducer means may be provided to direct sonic wave energy upwardly to assist in removal of the contaminant particles from the wafer surfaces. As shown such means includes 12 transducers m fitting together side-by-side and bonded to the bottom wall 61 of the tank as shown in FIG. 13. Each transducer m can have a width of one inch and extend parallel to the rods 51 and 52 a distance of 6 or 7 inches, preferably corresponding to the width of the wafer array W.

A flat circular electrode or charge plate 100 with a diameter about the same as or somewhat smaller than the diameter of the wafers is mounted at the outside face of each tank side wall 62 and is connected to a suitable electric power source by electric lines 101 or 102. The electrode is charged by applying a positive or negative voltage, such as 5 to 40 volts, sufficient to induce an effective charge at the outer surface of each and every wafer in the array W. The voltage at lines 101 and 102 is controlled and can be periodically reversed.

In this system the front faces of the silicon wafers containing the microcircuits are charged by induction and will repel contaminant particles while negatively charged. The positive charge on the rear face of each wafer in the array W will attract-negatively charged particles.

Removal of microscopic contaminants can be enhanced by continually reversing the electric charge at the wafer face at a high frequency, such as 60 cycles per second or higher, to agitate or disorient the water molecules at or near the wafer face, as suggested in provisional application No. 60/097,057, and to promote tremulous movement or loosening of the bound particles.

When a DC power source is provided, suitable switch means can be used to reverse polarity at suitable intervals (e.g., 1 to 10 reversals per second). The reversals from positive to negative should be controlled so that the front faces of the wafers with the microcircuits are negatively charged at least half and preferably most of the time (e.g., 60 to 90 percent of the time) to assure adequate particle removal. An important advantage of voltage reversal is the ability to clean both the front and rear faces of each wafer and to limit the number of particles deposited on the rear faces. The invention also contemplates charging of the wafers during cleaning by means of a conventional type of alternating current source (perhaps 20 to 60 cycles per second or more).

In the manufacture of microelectronic devices or the like by the 362-step fabrication process of the aforesaid SEMATECH publication, pages B-3 to B-14, contamination by sub 0.1-micron "killer" particles can be minimized by applying to each process wafer a predetermined limited voltage, such as 5 to 60 volts, during the various wet cleaning or processing operations while the wafer is within the glass receptacle (10) of FIGS. 1 and 2. For example, the desired negative or positive electric charge can be applied to the wafer (w) during each of the necessary wet processing operations including the RCA-type wet cleans, such as steps 2, 5, 23, 129 and 154; HF cleans, such as steps 65, 93⁻ and 133; post CMP cleans, such as steps 175, 212, 248 and 320; and resist strips with $H_2SO_4$, such as steps 13, 22, 62, 105, 143, and 187.

In carrying out the preferred wafer cleaning process of the present invention as herein described, the front face of the flat semiconductor wafer is negatively charged to a limited voltage, such as 5 to 40 volts, insufficient to create a substantial risk of harm or damage to any of the delicate microcircuits on that face. The negative charge on the wafer surface at that face is associated with a substantial charge density and an effective field intensity (preferably at least 0.02 volts/mm) sufficient to achieve or assure effective removal of contaminant colloidal-size and sub 0.05 micron particles that are bonded to or adhere to the wafer surface because of van der Waals forces and other bonding forces. A variety of bonds may be involved including covalent, coulombic, ionic, electrostatic, dipole-dipole and hydrogen bonds.

It will be understood that the electropurge wafer cleaning process of this invention is preferably carried out using conventional cleaning liquids or conventional RCA-type cleaning systems and that megasonic transducer means are desirable (e.g., particularly when cleaning the wafers with an ammoniacal hydrogen peroxide solution, such as SC-1) to set up high pressure waves in the cleaning solution. The transducers can be made of a suitable piezoelectric material, such as lead zirconate titanate or other commonly used material.

The use of megasonic transducers to improve the conventional RCA-type wet processing operations is described by Werner Kern in an article at pages 81 to 105 of the March 1985 issue (Volume 46, Number 1) of RCA Review, a well-known technical journal that was published quarterly by RCA Laboratories, Princeton, N.J. The transducers made it possible to use lower temperatures, such as 40° C. to 50° C., during SC-1 cleaning instead of the usual temperatures of 700 to 75° C. The megasonic RCA-type cleaning methods described in this 1985 article can, of course, be employed in the practice of my invention using a single-wafer cleaning system of the type disclosed in connection with FIGS. 1 to 7 or a batch-type cleaning system as disclosed in connection with FIGS. 13 and 14.

Excellent results can, for example, be obtained with a process and apparatus of the type described in connection with FIGS. 13 and 14 using standard 5-tank or 7-tank wet benches of the type previously described herein with the standard or commonly used cleaning sequences. A typical 5-tank wet bench can start with an HF strip and DI water rinse followed by SC-1, DI rinse, SC-2 and DI rinse. A 7-tank wet bench used during the practice of this invention (e.g., to clean the 25-wafer array W) could include a final HF bath followed by another DI rinse before the final drying operations.

For example, when using a tank comparable to the tank 60 of FIGS. 13 and 14 and provided with electrode means, such as the flat electrodes 100, to charge the wafers, the tank could be filled with an RCA SC-1 solution with a high pH of at least about 10 or higher when using the usual 5:1 volume ratio of DI water and ammoniom hydroxide. If the cleaning process is carried out with the assistance of megasonic transducers m, the temperature of the SC-1 solution could be in the range of 45° to 60° C. and the total time in the tank could be about 8 to about 10 minutes. If the megasonic assist is omitted, a higher temperature, such as 65° to 70° C. could be advantageous to limit the time to 10 minutes or less.

As the feature size or line width of advanced microchips is reduced below 0.15 micron, the concentration of the wet cleaning solutions can be very important. It becomes important to obtain a clean and smooth or atomically flat silica wafer surface (e.g., with surface roughness values preferably under 2 Angstroms). In order to avoid excessive etching and unacceptable surface roughness, dilution of the RCA-type cleaning solutions may be desirable.

The progressive reduction of MOS transistor dimensions will soon require ultrathin gate oxides less than 30 Angstroms thick and low rms interface roughness (e.g., below 2 Angstroms). In order to minimize interfacial microroughness for 15- to 30-Angstrom gate oxides, the wet cleaning or wet etching solutions should be diluted with substantial amounts of DI water. For example, a solution of 49% HF:98% $H_2SO_4$: $H_2O$ (1:0.5:30) has been found suitable for wet chemical etching of the sacrificial $SiO_2$ layer. In order to reduce the objectionable surface roughening effect of SC-1 solutions, a dilute solution can be used, such as $NH_4OH:H_2O_2:H_2O$ (1:8:64).

When employing a dilute or ultra-dilute RCA SC-2 clean recipe for wet cleaning (e.g., after an SC-1 clean), it is not necessary to employ hydrogen peroxide. The dilute or ultra-dilute RCA clean can employ a 100:1 or 1000:1 dilution of 37% HCl in water at 45° C., for example. Metal removal efficiency of this solution is very high with or without the assistance of megasonic energy, particularly when the dilute solution is employed in the electropurge process of this invention (e.g., with a wafer charge of 2 to 60 volts and a field intensity of at least 0.02 volts/mm).

In the practice of the present invention electropurge cleaning with limited wafer charges, such as 2 to 60 volts, can be effective with the dilute RCA and ultra-dilute RCA (SC-1 and SC-2) cleans with or without the assistance of megasonic energy (which can be damaging to delicate nanoscale circuits).

The need for ultrathin gate oxides to improve MOS device performance imposes stringent requirements on the silicon/gate oxide interface roughness to satisfy yield criteria and provide device reliability. Interface roughness not only degrades device performance by reducing the channel mobility, but may also affect reliability and yield by introducing asperities which act as electrical punctures. Even if the oxide is conformal, an asperity is an electric weak point due to the field lines associated with that topography. Therefore, it is important to consider the various contributions to roughness during device fabrication and employ methods which tend to minimize problems, especially when using ultrathin gate oxides with a thickness in the range of 10 to 30 Angstroms.

Advanced microchips are becoming more delicate and increasingly vulnerable as the feature sizes and line widths are progressively reduced. At the same time the industry performance standards for microelectronic devices are increasing to satisfy the need for better and more reliable devices. It is becoming more difficult to obtain satisfactory yields of advanced microchips with the quality, reliability and longevity meeting those high standards and the demands of consumers.

As the feature size is reduced, there is an increase in the number or frequency of imperfections, defects and potential problems areas, such as the electric weak points referred to above. In order to meet the reliability and yield requirements and avoid known and unknown hazards, there is reason to disapprove questionable or risky procedures which might be unsafe or detrimental.

For these and other reasons, the electric charge applied to the silicon wafers in the practice of this invention should be limited and may be relatively small (e.g., from 4 to 30 volts). Excessive voltage should be avoided to minimize the risk of harm or damage to the delicate or sensitive microcircuits. A voltage of 70 volts or more is usually unnecessary or disadvantageous and might be imprudent for the more highly advanced microchips because of the potential detrimental, degrading or undermining affects on the more vulnerable or sensitive portions of the delicate microcircuits.

In order to help in the removal of sub-micron particles from the wafer surface, the surface should be charged with an effective negative voltage to provide an effective field intensity at said surface. Such field intensity should be at least 0.02 volts/mm and sufficient to cause or permit effective removal of sub 0.1-micron particles but insufficient to create a substantial risk of adverse affects or harm to the more vulnerable portions of the microcircuits.

The use of low voltages in the range of 4 to 40 volts is prudent and often preferred, particularly during BEOL wet processing where there are more problems and difficulties and the risk of harm or loss due to excessive voltage is much greater. Such low voltages provide a higher degree of safety and can be remarkably effective in dislodging, removing and repelling sub 0.05-micron and colloidal-size contaminant particles which cause "killer defects" in advanced microchips, such as those having feature sizes of from 0.06 to 0.10 micron.

The present invention is a godsend to the semiconductor industry, which heretofore had no practical and effective way to eliminate "killer" particles of sub 0.05-micron size or to reach target defect-density goals, such as those set forth in TABLE 1 on page 5 hereof. That table describes the SEMATECH yield model and equipment defect goals based on the model for pilot line and high-volume manufacturing. The table is taken from a printed SEMATECH publication dated Jul. 31, 1994 and entitled "Contamination-Free Manufacturing Handbook" (Identified as 94062428A-TR). That publication provides information that covers most, if not all, aspects of contamination control methodology for semiconductor equipment and processes.

The more recent National Technology Roadmap for Semiconductors as published by Semiconductor Industry Association (SIA) was reproduced in SEMICONDUCTOR INTERNATIONAL (January 1998), pg. 40 (and Table 1) of which is incorporated herein by reference for all purposes. The SIA Roadmap estimates process-specific defect densities for future 0.25 micron (um) to 0.05-micron devices (up to the year 2012) and proposes defect targets for future generations of devices based on 60% yield for initial production.

It will be understood that the above description is by way of illustration rather than limitation and that variations and modifications of the specific processes and devices disclosed herein may be made without departing from the spirit of the invention.

We claim:

1. In a process for fabrication of microelectronic devices on silicon wafers wherein microcircuits are formed on the front face of a wafer by a plurality of layering, patterning, doping and heating operations and the wafer is wetted and repeatedly subjected to cleaning, rinsing and drying operations to remove contaminants, the improvement wherein said front face of the process wafer is artificially charged during wet processing to provide an effective field intensity and a negative voltage of at least 2 volts sufficient to cause effective removal of harmful sub 0.05-micron particulates bonded to the wafer surface, the wafer being charged by induction to prevent electrolysis.

2. A process according to claim 1 wherein particulate contaminants are removed and substantially eliminated from a wafer by providing the front face of the wafer with a limited electric charge during wet processing steps insufficient to degrade the microcircuits, the charge being sufficient to provide a field intensity at said front face effective to dislodge and remove sub 0.05-micron particulates bonded at the wafer surface.

3. A process according to claim 1 where a row of 10 or more silicon wafers is supported in a vessel or wafer carrier during the cleaning operations, the front face of each wafer being charged to a limited negative voltage, such as 2 to 60 volts, insufficient to harm the delicate microcircuits formed on that face and having a field intensity of at least 0.02 volts/mm sufficient to cause efficient removal of harmful sub 0.05-micron particulates.

4. A process according to claim 1 wherein the face of the wafer is artificially provided with an electric charge during the wet cleaning operations to provide a field intensity sufficient to cause effective removal of sub 0.05-micron particles and wherein the electric charge at the wafer face is reversed at high frequency to agitate the particles and excite or disorient water molecules at or near the wafer face.

5. A process for cleaning silicon wafers having delicate microcircuits formed on the front faces in which a single row of 10 to 20 or more closely-spaced wafers is mounted in a thin-wall receptacle containing ultrapure DI water and is submerged while the wafers are held in axial alignment and in parallel vertical positions, electrode means comprising positive and negative electrodes being provided at opposite ends of said row that are separated from the water in the receptacle to prevent electrolysis, and in which all of the wafers are simultaneously and uniformly charged by induction to a voltage sufficient to cause effective removal of sub 0.05-micron particulates, the electric charge induced at the face of each wafer being reversed periodically to agitate or disorient polarized water molecules at the wafer face.

\* \* \* \* \*